United States Patent
Seyerle et al.

(10) Patent No.: US 9,018,904 B2
(45) Date of Patent: Apr. 28, 2015

(54) WIRELESS BATTERY CHARGING APPARATUS MOUNTED IN A VEHICLE DESIGNED TO REDUCE ELECTROMAGNETIC INTERFERENCE

(75) Inventors: Donald R. Seyerle, Grand Blanc, MI (US); Howard E. Kendall, Northville, MI (US); Laura L Ball, Milford, MI (US); David J. Trzcinski, Howell, MI (US)

(73) Assignee: GM Global Technology Operations LLC, Dertoit, MI (US)

( * ) Notice: Subject to any disclaimer, the term of this patent is extended or adjusted under 35 U.S.C. 154(b) by 385 days.

(21) Appl. No.: 13/557,441

(22) Filed: Jul. 25, 2012

(65) Prior Publication Data

US 2013/0038279 A1   Feb. 14, 2013

Related U.S. Application Data

(60) Provisional application No. 61/523,200, filed on Aug. 12, 2011.

(51) Int. Cl.
*H02J 7/00* (2006.01)
*H05K 9/00* (2006.01)
*B60R 16/033* (2006.01)
*H01F 27/36* (2006.01)
*H01F 38/14* (2006.01)
*H02J 5/00* (2006.01)
*H02J 7/02* (2006.01)

(52) U.S. Cl.
CPC ............. *H05K 9/002* (2013.01); *B60R 16/033* (2013.01); *H01F 27/36* (2013.01); *H01F 38/14* (2013.01); *H02J 5/005* (2013.01); *H02J 7/0044* (2013.01); *H02J 7/025* (2013.01); *Y02T 90/122* (2013.01)

(58) Field of Classification Search
USPC .................................................. 320/113, 115
See application file for complete search history.

(56) References Cited

U.S. PATENT DOCUMENTS

| | | | |
|---|---|---|---|
| 6,738,249 B1 * | 5/2004 | Anthony et al. | 361/117 |
| 6,888,438 B2 * | 5/2005 | Hui et al. | 336/200 |
| 8,816,636 B2 * | 8/2014 | Shinde et al. | 320/108 |
| 2008/0265835 A1 | 10/2008 | Reed et al. | |
| 2011/0156637 A1 | 6/2011 | Thorsell et al. | |

FOREIGN PATENT DOCUMENTS

| | | |
|---|---|---|
| CN | 1409942 A | 4/2003 |
| CN | 101317268 A | 12/2008 |
| CN | 101657337 A | 2/2010 |
| CN | 101971453 A | 2/2011 |
| CN | 201781332 U | 3/2011 |

(Continued)

OTHER PUBLICATIONS

State Intellectual Property Office of the Peoples' Republic of China, Office Action for Chinese Patent Application No. 201210332217.3, mailed May 28, 2014.

(Continued)

*Primary Examiner* — Nghia Doan
(74) *Attorney, Agent, or Firm* — Ingrassia Fisher & Lorenz, P.C.

(57) ABSTRACT

A vehicle is provided having a wireless battery charger that is mounted within the vehicle, and an electrostatic shield for reducing electromagnetic interference radiated by the wireless battery charger.

25 Claims, 9 Drawing Sheets

(56) References Cited

FOREIGN PATENT DOCUMENTS

| | | |
|---|---|---|
| CN | 102077438 A | 5/2011 |
| JP | 2007104868 A | 4/2007 |
| JP | 2009296780 A | 12/2009 |
| KR | 20100133557 A | 12/2010 |
| WO | 2008040200 A1 | 4/2008 |

OTHER PUBLICATIONS

State Intellectual Property Office of the Peoples' Republic of China, Office Action for Chinese Patent Application No. 201210334205.4, mailed Jun. 4, 2014.

* cited by examiner

WIRELESS BATTERY CHARGING APPARATUS MOUNTED IN A VEHICLE DESIGNED TO REDUCE ELECTROMAGNETIC INTERFERENCE

CROSS-REFERENCE TO RELATED APPLICATIONS

This application claims the benefit of U.S. Provisional Application No. 61/523,200 filed Aug. 12, 2011, the contents of which are herein incorporated by reference.

TECHNICAL FIELD

Embodiments of the present invention generally relate to vehicles, and more particularly relate to battery charging systems and apparatus implemented within a vehicle for charging rechargeable electronic devices.

BACKGROUND OF THE INVENTION

Today a wide variety of electronic devices are commercially available that are powered by power cells commonly referred to as batteries. Many such power cells are rechargeable electrochemical cells also referred to as rechargeable batteries. Electronic devices that include such rechargeable electrochemical cells can be referred to as rechargeable electronic devices. Examples of rechargeable electronic devices include modern mobile communication devices, such as computers, cellular telephones portable/mobile radios, personal digital assistants, video terminals, portable/mobile computers with wireless modems, and other wireless communication devices. For purposes of the following discussions, a wireless communication device may also referred to in the art as a subscriber device, a mobile station, mobile equipment, a handset, a mobile subscriber, user equipment, or an equivalent used in any wireless communication standard.

A wired charger device can be used to recharge the power cells in such devices. For example, cellular phones and other wireless communication devices have traditionally been charged via a wired charger device that includes a plug-in cord. The wired charger device connects to a power jack socket on the rechargeable electronic device. The power jack socket is wired to contacts with the terminals of the rechargeable electrochemical cells. The wired charger itself usually consists of a plug box containing a step-down transformer and an AC-DC converter or rectifier which is wired via a charging cable to a connecting plug. When in use, the plug box is plugged into an electrical outlet (a 120 V or securing block 240 V mains socket) or a USB port if the charger is USB compatible. The connecting plug is coupled to the rechargeable electronic device that is to be charged.

There are numerous drawbacks associated with wired charger devices. Wired charger devices are bulky items to carry around, and the wire trailing between the device and the plug box can be unsightly. Therefore most users of compact portable equipment such as cell phones and the like do not carry wired chargers with them. Moreover, if the trailing wire is snagged or jerked, the wire; the connectors; the socket; or the wall may be damaged. Furthermore, the rechargeable electronic device may be pulled to the ground. In addition, because not all manufacturers use the same type of wired charger, if a user forget or looses their cable it's not always easy to find a replacement. These are just a few examples of some of the drawbacks or problems that are regularly associated with such "wired chargers."

Recently, inductive battery charger systems have been developed such as the system described in U.S. Pat. No. 7,164,255 to Hui, which is incorporated herein by reference in its entirety. In Hui's system a planar inductive battery charging system is designed to enable electronic devices to be recharged without wires, and can therefore be referred to as a wireless battery charging system. The system includes a planar charging module. The planar charging module has a charging surface or mat, and parallel to the charging surface is at least one primary coil or winding, and in some cases an array of primary coils or windings. The planar charging module can be plugged into an electrical power source (e.g., a standard outlet, or a USB port). An electronic device to be recharged is placed on the charging surface, and the primary coil(s) can then inductively couple energy to a secondary coil of the device to be recharged. In some conventional electronic devices that do not include secondary coils when manufactured, a separate module (sometimes referred to a receiver) can be coupled to the conventional electronic device to allow it to work with the wireless charger. The receiver has secondary coil(s) that allow the device to be charged via magnetic induction.

SUMMARY

To eliminate the need for wired chargers, General Motors (GM) has proposed integrating wireless or inductive chargers into a vehicle to implement a wireless battery charging system within the vehicle for wirelessly charging rechargeable electronic devices. These systems and apparatus include a wireless charging module that has a charging surface, and one or more windings parallel to the charging surface (e.g., an array of primary windings parallel to the charging surface). This will allow occupants (e.g., drivers and passengers) to place their rechargeable electronic devices on a charging surface or "mat" within the vehicle and wirelessly recharge them while in the vehicle.

Wireless chargers such as those described above are normally implemented within a home or office environment, where a user can simply place the rechargeable electronic device on surface of the wireless charger so that it rests on that surface. When integrating wireless chargers into a vehicle to develop a vehicle-based wireless charging system, many problems arise since a vehicle is a far different environment than a home or office environment.

One problem that arises in the context of motor vehicles is that they include a wide array of other electronic components, devices and apparatus. A wireless charger carries rapidly changing electrical currents. As such, integrating a wireless charger within a vehicle can be problematic since it emits electromagnetic fields when operating to charge a rechargeable electronic device. The electromagnetic radiation can potentially be received by other electrical apparatus within the vehicle as electromagnetic interference (EMI) (also called radio frequency interference or RFI) with respect to those electrical apparatus. As used herein, EMI refers to a disturbance that affects an electrical apparatus within a vehicle due to either electromagnetic induction or electromagnetic radiation emitted from a wireless charger integrated within a vehicle. The disturbance may interrupt, obstruct, or otherwise degrade or limit the effective performance of electrical apparatus within the vehicle. For example, EMI radiated by a wireless charger can affect the reception of AM radio.

Embodiments of the present disclosure relate to wireless battery charging systems and wireless battery charging apparatus (also referred to herein as a "wireless charging device" or "wireless charger") that are implemented within a vehicle for wirelessly charging rechargeable electronic devices. An electromagnetic shield apparatus is provided for reducing electromagnetic interference caused by an on-board wireless battery charging apparatus when it is wirelessly charging a battery of a rechargeable electronic device. These embodiments allow a wireless battery charging system to be implemented within a vehicle by reducing or preventing electromagnetic interference with on-board electronics in the vehicle. This way the wireless charger can be used for wirelessly charging a battery of a rechargeable electronic device without interfering with on-board electronics in the vehicle.

In one embodiment, a vehicle is provided that comprises electronic components mounted in or on the vehicle, and a wireless battery charging system. The wireless battery charging system comprises a wireless battery charging apparatus mounted within the vehicle, and an electrostatic shield. The wireless battery charging apparatus comprises: a primary coil is capable of inductively coupling magnetic energy for wirelessly charging a rechargeable electronic device. The electrostatic shield is designed to reduce electromagnetic fields from being coupled to the electronic components of the vehicle.

DESCRIPTION OF THE DRAWINGS

Embodiments of the present invention will hereinafter be described in conjunction with the following drawing figures, wherein like numerals denote like elements.

DESCRIPTION OF EXEMPLARY EMBODIMENTS

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

Figure 1:
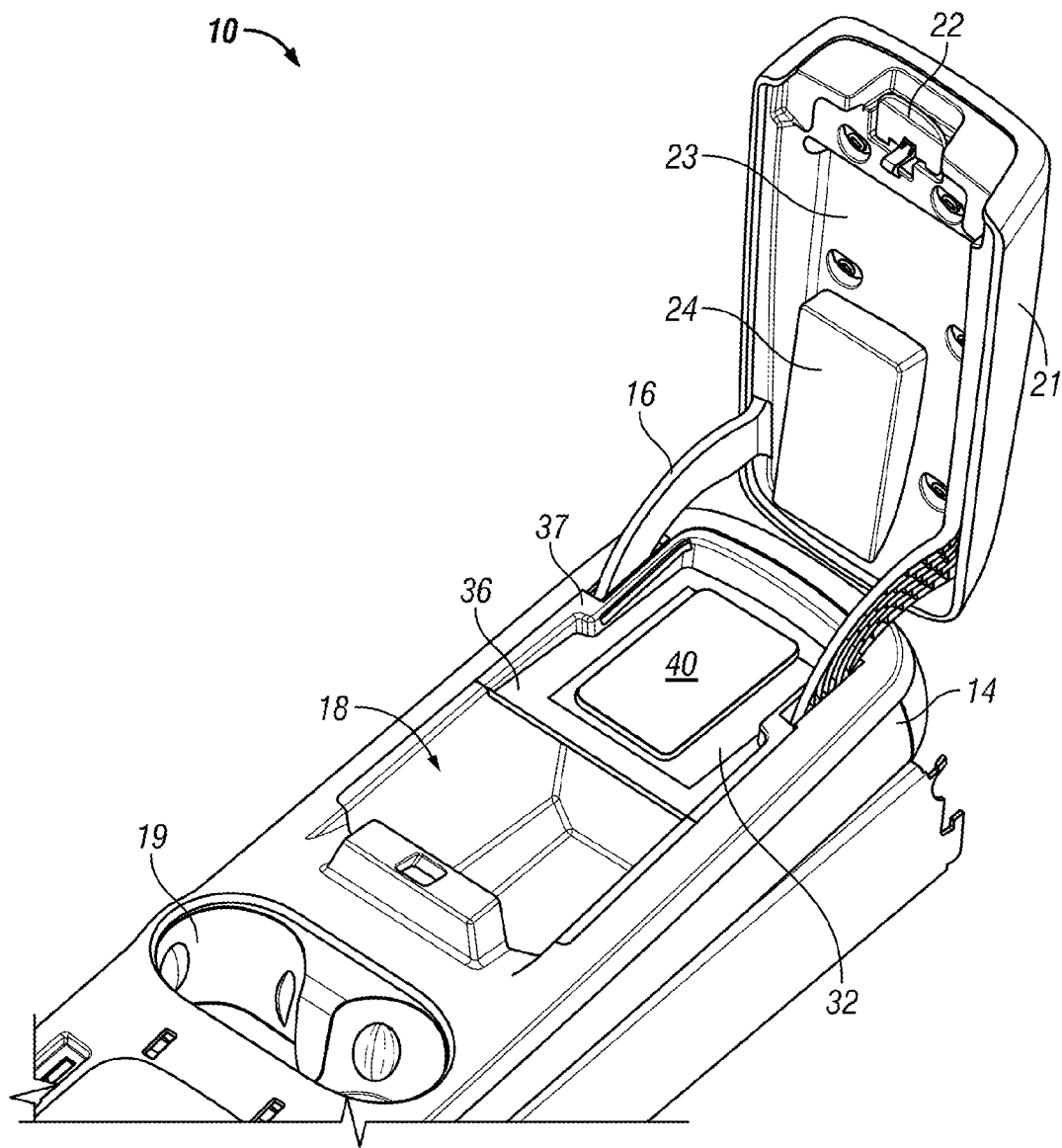
FIGS. 1, 3 and 4 are perspective views of a floor console armrest assembly in accordance with some of the disclosed embodiments.
Figure 2:
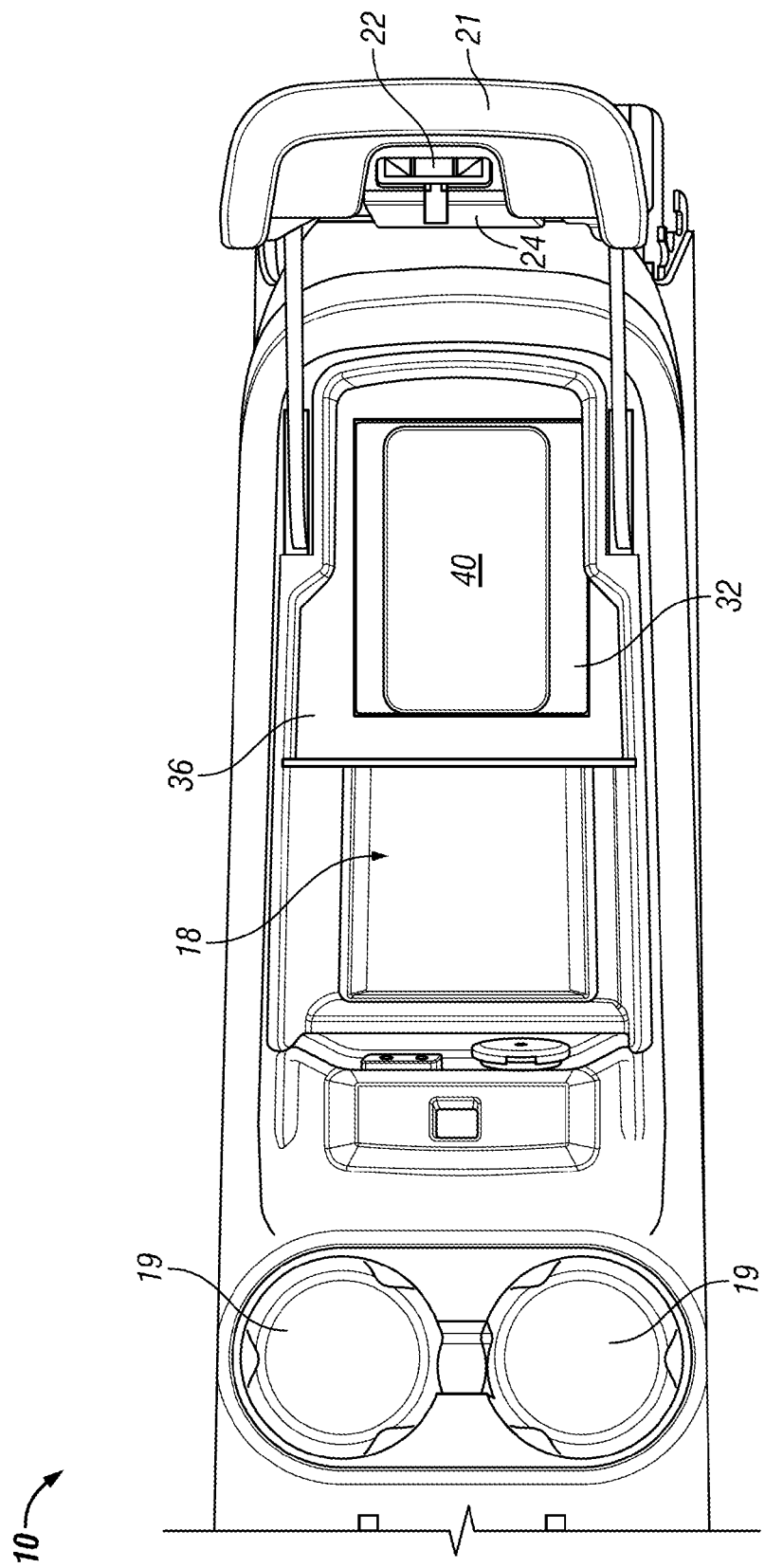
FIG. 2 is a top view of a vehicle console floor console armrest assembly in accordance with some of the disclosed embodiments.
Figure 3:
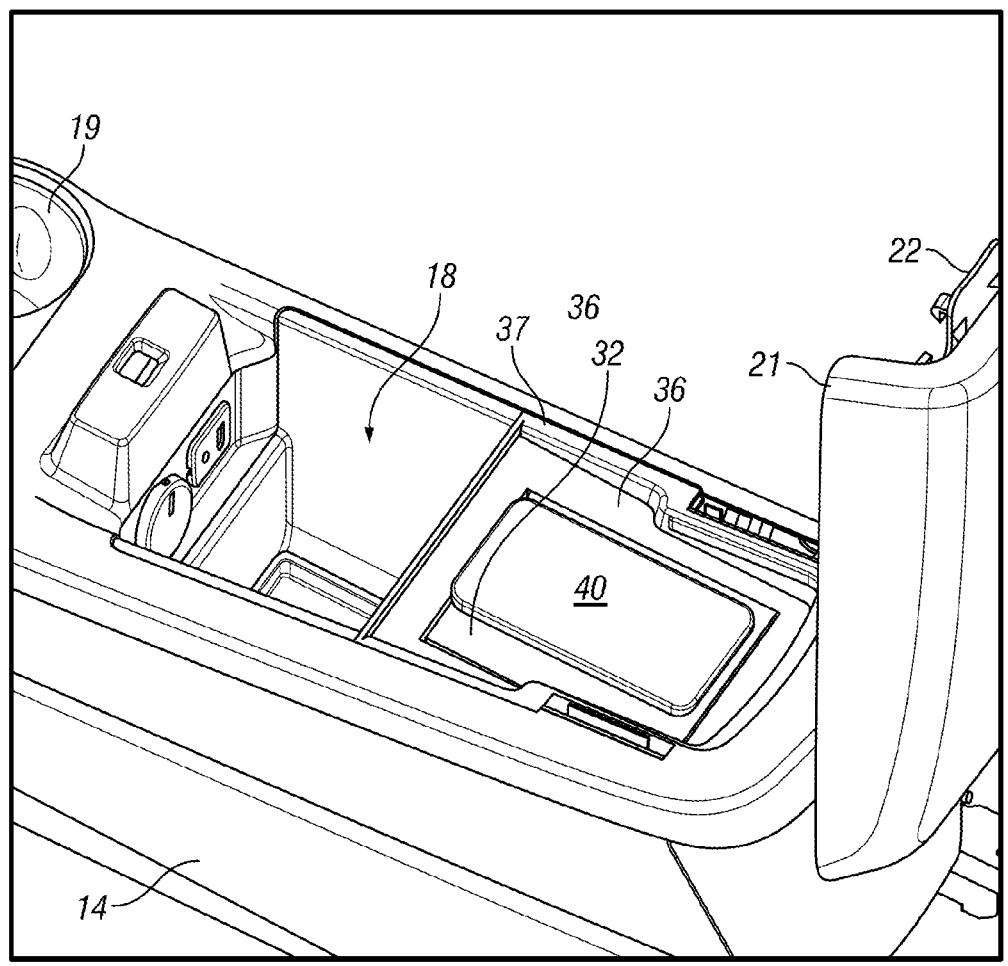
Figure 4:
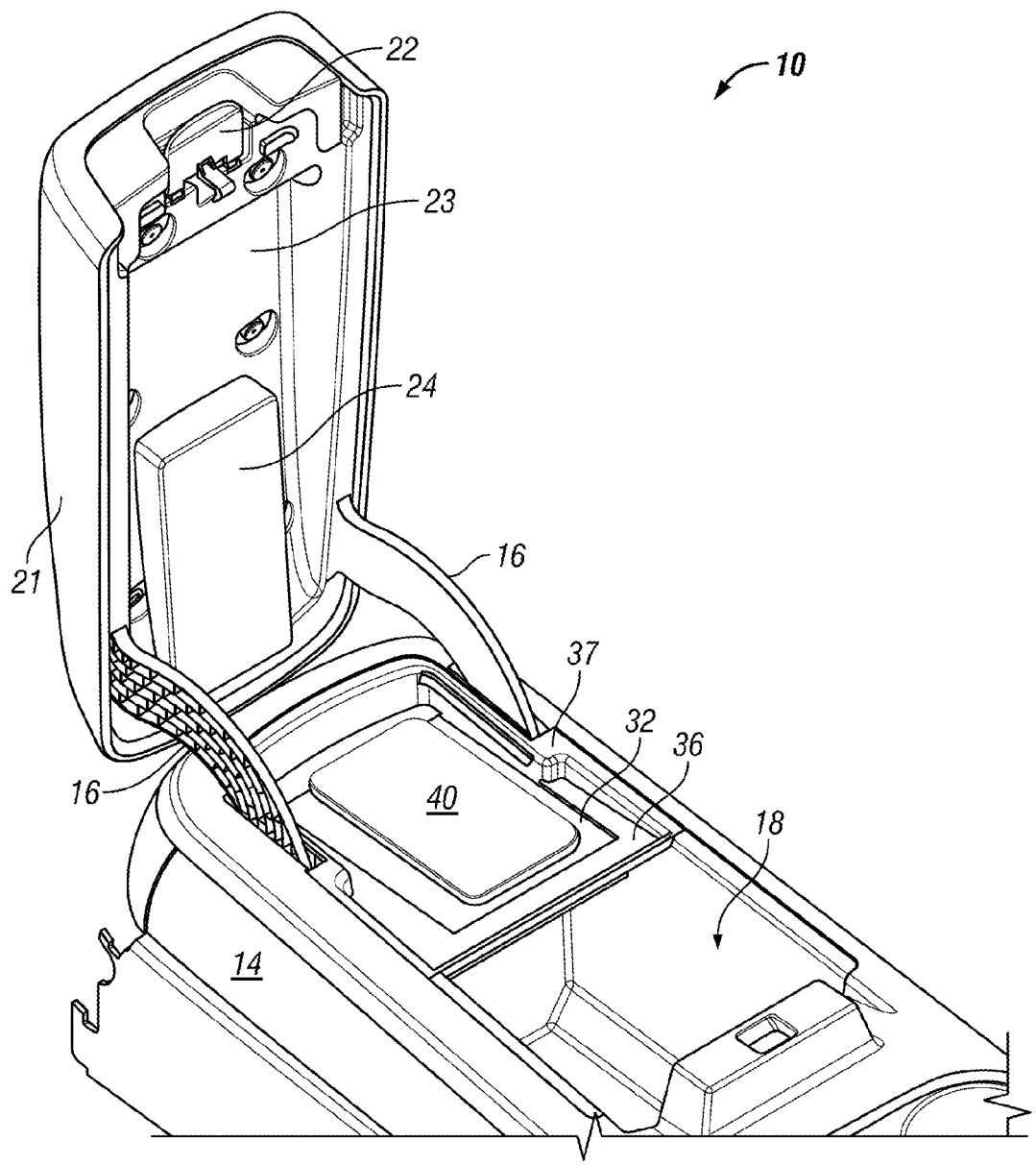
Figure 5:
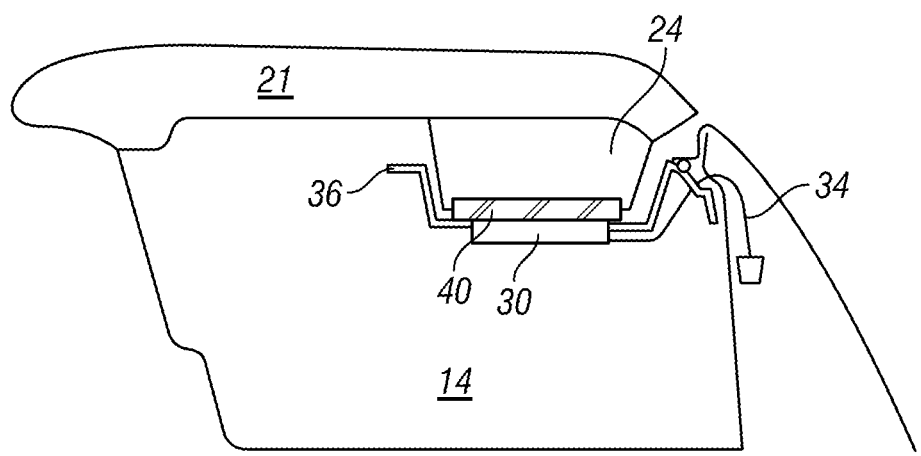
FIG. 5 is a side view of a vehicle console floor console armrest assembly in accordance with some of the disclosed embodiments when a console lid is in a closed position.

FIGS. 1, 3 and 4 are perspective views of a floor console armrest assembly 10 in accordance with some of the disclosed embodiments, and FIG. 2 is a top view of a vehicle console floor console armrest assembly 10 in accordance with some of the disclosed embodiments. FIGS. 1-4 illustrate the floor console armrest assembly 10 when a console lid 21 of the floor console armrest assembly 10 is in an open position. FIG. 5 is a side view of a vehicle console floor console armrest assembly 10 in accordance with some of the disclosed embodiments. FIG. 5 illustrates the floor console armrest assembly 10 when the console lid 21 is in a closed position.

The floor console armrest assembly 10 includes a console base 14 and a console lid 21. The console lid 21 is coupled to the console base 14 via a hinge 16. The console base 14 includes a storage compartment 18 and other features such as cup holders 19. Numerous other features can be included on or within the assembly 10 without departing from the scope of the present invention, but are not illustrated for sake of clarity. In accordance with some of the disclosed embodiments, the console lid 21 includes a bottom surface 23 having a securing block 24 mounted thereon, and a mounting apparatus 36 with a tray 37 is provided within the storage compartment 18 of the floor console armrest assembly 10.

In accordance with some of the disclosed embodiments, a wireless charging module 30 can be mounted to an underside of the mounting apparatus 36, and therefore resides in the compartment 18 beneath the mounting apparatus 36. The mounting apparatus 36 holds the wireless charging module 30 in place within the storage compartment 18.

In accordance with some of the disclosed embodiments, the securing apparatus includes the securing block 24 and the mounting apparatus 36. As will be explained below, when the console lid 21 is moved into a closed position (FIG. 5), the securing block 24 and the mounting apparatus 36 cooperate to hold the rechargeable electronic device 40 in a fixed location with respect to the charging surface 32 of the wireless charging module 30, and to secure the rechargeable electronic device 40 in a fixed position within the storage compartment 18.

Figure 6:
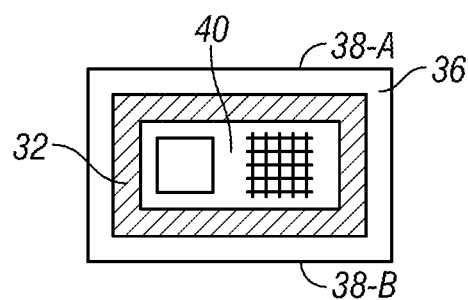
FIG. 6 is a top view of a mounting apparatus that sits within the vehicle console floor console armrest assembly in accordance with some of the disclosed embodiments.

FIG. 6 is a top view of the mounting apparatus 36 and tray 37 that sit within the vehicle console floor console armrest assembly 10 in accordance with some of the disclosed embodiments.

The securing block 24 is directly or indirectly secured or attached to the underside of the console lid 21, and can be any suitable material that will provide an interface to the rechargeable electronic device 40 that has sufficient rigidity to hold the rechargeable electronic device 40 in a fixed position with respect to the charger surface 32 when the console lid 21 is in a closed position, but will not damage the rechargeable electronic device 40 when the console lid 21 is in a closed position. In some embodiments, the securing block 24 can be fabricated from a lightweight cellular engineering material such as a solid foam material. In some implementations, the securing block 24 can be fabricated from open cell structured foam materials (also known as reticulated foams). As is known to those skilled in the art, open cell structured foams contain pores that are connected to each other and form an interconnected network which is relatively soft. In one implementation, the securing block 24 can be fabricated from a polymer-based open cell foam material such as polyurethane-based foam material.

The securing block 24 can have any shape or geometry that allows it to contact the device 40 and hold the device 40 in a fixed position when the console lid 21 is closed. For instance, the securing block 24 can be a block-like structure made from a soft open cell foam material.

The wireless charging module 30 can be mounted to an underside (not shown) of the mounting apparatus 36 such that the mounting apparatus 36 holds the wireless charging module 30 in place within the storage compartment 18 of the floor console armrest assembly 10. In one implementation, the mounting apparatus 36 has edge portions 38-A, 38-B (adjacent to and around the perimeter of the tray 37) that are supported by a lip of the console base 14. The tray 37 can have a cut-away portion (e.g., located in the center of the tray 37 and centered within the tray 37) that is in alignment with the securing block 24 when the console lid 21 is in a closed position. The cut-away portion exposes at least a portion of the charger surface 32 of the wireless charging module 30. When the console lid 21 is moved downward towards its closed position, the hinge 16 retracts into the floor console armrest assembly 10 and the console lid 21 moves downward until it eventually reaches a closed position, as illustrated in FIG. 5. When the console lid 21 is in the closed position, the securing block 24 presses against the rechargeable electronic device 40 and along with the exposed portion of the charger surface 32 holds the rechargeable electronic device 40 in a fixed position with respect to the charger surface 32 of the wireless charging module 30 so that the rechargeable electronic device 40 is secured or maintained in the fixed position with respect to the charger surface 32 of the wireless charging module 30.

As will be described below, a rechargeable electronic device 40 can be placed on the exposed portion of the charger surface 32 of the wireless charging module 30 so that the rechargeable electronic device 40 can be charged or re-charged.

Wireless Charging Module

Figure 7:
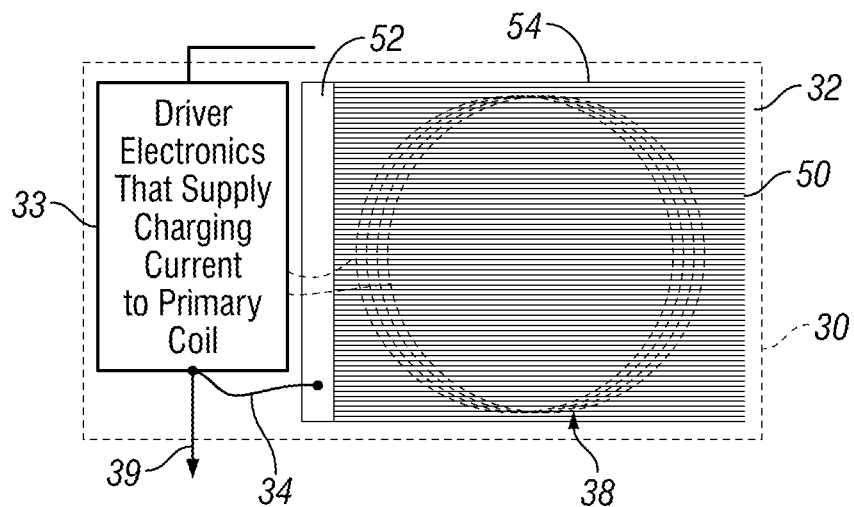
FIG. 7 is a block diagram of a top view of a wireless charging module in accordance with some of the disclosed embodiments.
Figure 8:
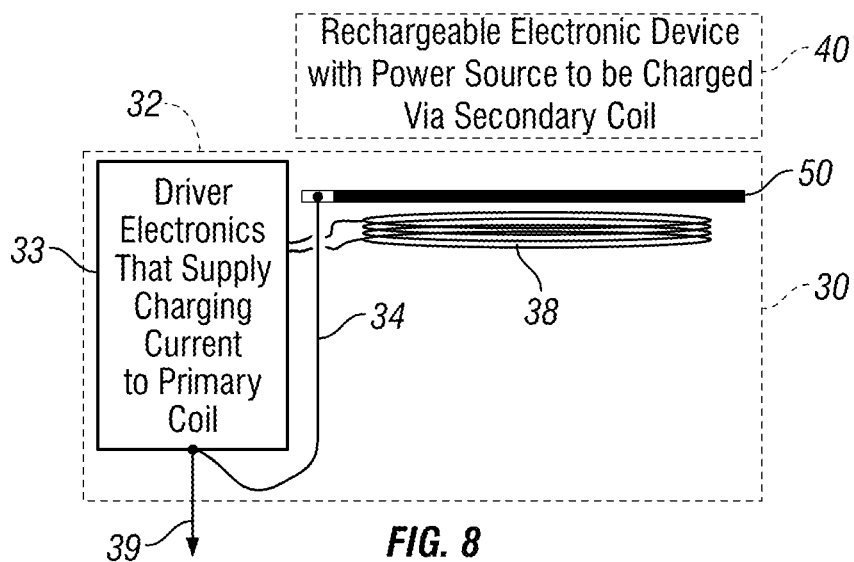
FIG. 8 is a block diagram of a cross-sectional side view of a wireless charger wireless charging module of FIG. 7 in accordance with some of the disclosed embodiments.

FIG. 7 is a block diagram of a top view of a wireless charging module 30 of FIGS. 1-4 in accordance with some of the disclosed embodiments. FIG. 8 is a block diagram of a cross-sectional side view of a wireless charger wireless charging module 30 of FIG. 7 in accordance with some of the disclosed embodiments. In accordance with the disclosed embodiments, the wireless charging module 30 includes a charger surface 32, a driver module 33, and primary inductive charging coils 38 embedded within the wireless charging module 30. The driver module 33 includes driver electronics that are coupled via wires to a vehicle power supply, such as a battery (not illustrated). The driver module 33 uses the vehicle power supply (not illustrated) to apply an oscillating electric potential across the primary inductive charging coils 38.

The primary inductive charging coils 38 serve as the primary coil of an inductive couple.

The rechargeable electronic device 40 includes a receiver module (not illustrated) that includes a secondary coil (not illustrated in FIG. 7).

When an oscillating electric potential is applied across the primary coils 38, an oscillating magnetic field is generated, which may in turn induce an oscillating electrical current in the secondary coil (not illustrated) of the rechargeable electronic device 40 if the secondary coil of the rechargeable electronic device 40 is placed close to the primary inductive charging coils 38. In this way, electrical energy is transmitted from the primary inductive charging coils 38 to the secondary coil by electromagnetic induction without the two coils being conductively connected. When electrical energy is transferred from the primary inductive charging coils 38 to a secondary coil the pair are said to be inductively coupled. An electric load (e.g., battery of the rechargeable electronic device 40) wired across (i.e., in parallel) with the secondary coil may draw energy from the power source when the secondary coil is inductively coupled to the primary inductive charging coils 38.

Thus, inductive coupling between the primary inductive charging coils 38 and the secondary coil of the rechargeable electronic device 40 allows energy to be transferred from the power supply (not illustrated) to an electric load (e.g., battery of the rechargeable electronic device 40) without any conduction path (e.g., connecting wires). The wireless charging module 30 allows a vehicle occupant to place their rechargeable electronic device 40 on the exposed charging surface 32 of the wireless charging module 30 to provide a simple, fast and efficient way to keep the rechargeable electronic device 40 charged without the drawbacks associated with a wired charger that requires a cable.

The wireless charging module 30 also includes a variety of other features.

For example, magnetic attraction between the receiver module of the rechargeable electronic device 40 and the wireless charging module 30 assures that alignment between the primary inductive charging coils 38 and the secondary coil of the rechargeable electronic device 40 is precise and that efficient charging will occur. This helps ensure that the rechargeable electronic device 40 can be charged as fast as, or faster than, with wired chargers.

In addition, the receiver module of the rechargeable electronic device 40 and the wireless charging module 30 can communicate with each other e.g., via RFID, to allow the wireless charging module 30 to deliver an exact amount of power for a proper length of time to the rechargeable electronic device 40 so that transfer of power is safe and efficient and no energy is wasted.

The wireless charging module 30 can also include hardware (e.g., speakers, LEDs, etc.) that provides audio and visual indictors to the user. For example, in some implementations, a unique sound tells the user that a solid inductive connection has been made between the wireless charging module 30 and rechargeable electronic device 40 and that the rechargeable electronic device 40 is charging. In other implementations, a corresponding light indicator (e.g., via LEDs)

informs the user that wireless charging is occurring. Another unique sound can be communicated when the rechargeable electronic device 40 is removed from the charger surface 32 of the wireless charging module 30.

When a rechargeable electronic device 40 reaches full charge, power to that rechargeable electronic device 40 is shut off. This not only saves energy, but it also prevents overcharging of the device's battery, which can shorten battery life. Once full power is achieved and the shut off has occurred, the rechargeable electronic device 40 will continue to monitor the status of the battery. If the battery is not fully charged, the wireless charging module 30 can initiate and resume charging until the battery is fully charged.

Partial Faraday Cage Apparatus

The wireless charging module 30 uses coupled magnetic fields to charge the rechargeable electronic device 40. To explain further, a time changing voltage (dV/dt) across the primary inductive charging coils 38 (or "primary charging loops") creates electric fields, which can inadvertently be coupled to nearby electronics modules or AM/FM antennas in the vehicle. This can allow, for example, electrical noise generated by the wireless charging module 30 to unintentionally couple to the vehicle AM/FM antenna system and interfere with AM/FM radio reception.

To address these issues, in accordance with the disclosed embodiments, the wireless charging module 30 can also include a partial Faraday cage apparatus designed to reduce electric fields radiated by the wireless charging module 30. Two examples of the partial Faraday cage apparatus will now be described below with reference to FIGS. 7 through 11B.

Electrostatic Shield Embodiment

In one embodiment that is illustrated in FIGS. 7 and 8, the partial Faraday cage apparatus is a conductive electrostatic shield 50 that is designed to significantly reduce electric fields radiated by the wireless charging module 30 above the shield 50 and thus prevent them from being coupled to other electronics modules within the vehicle, while still permitting the magnetic field energy to be radiated in the region above the shield 50 so that the wireless charging module 30 can still charge a load that is inductively coupled to a primary coil of the wireless charging module 30.

The conductive electrostatic shield 50 is embedded within the wireless charging module 30 so that it is disposed directly overlying the primary inductive charging coils 38 of the wireless charging module 30. The conductive electrostatic shield 50 extends beyond the physical or geometrical dimensions of the primary inductive charging coils 38. To work properly, the conductive electrostatic shield 50 must be grounded, and in one embodiment that is illustrated in FIGS. 7 and 8, the conductive electrostatic shield 50 is electrically coupled to a vehicle ground reference 39 via shielded conductor 34 so that the conductive electrostatic shield 50 is electrically grounded. For example, in one implementation, a shield of the shielded conductor 34 can be electrically-connected to an electrical ground of electronics in the vehicle, which are also electrically-connected to the vehicle ground reference 39. The grounded shield is able to provide a termination of the electric fields (generated due to the switching of the charging currents that are carried by the primary inductive charging coils 38).

The conductive electrostatic shield 50 can have any shape or geometry that allows it to function as an effective electrostatic shield (e.g., a partial Faraday cage or shield) so that it can reduce or prevent electric fields that radiate from the wireless charging module 30 so that they are not coupled to vehicle electronics or antennas that are located near or in the vicinity of the wireless charging module 30. At the same time, the conductive electrostatic shield 50 still permits the magnetic field energy to charge the intended load of the rechargeable electronic device 40, which resides on the charging surface 32 above the conductive electrostatic shield 50. The conductive electrostatic shield 50 is designed to attenuate lower-frequency field components, while allowing the higher-frequency field components to reach and emanate from the rechargeable electronic device 40 so that intended signals are allowed to radiate from/to the rechargeable electronic device 40 that is being charged. For example, when the rechargeable electronic device 40 is a wireless communication device such as a cellular telephone, the conductive electrostatic shield 50 is designed to attenuate lower-frequency field components that could interfere with antennas and other electronics, while allowing the higher-frequency transmit and receive signals to be transmitted from or received by the wireless communication device.

In one embodiment that is illustrated in FIGS. 7 and 8, the conductive electrostatic shield 50 comprises an electrically-conductive plate. The electrically-conductive plate may comprise one or more conductive layers (e.g., a layer of ferrite material on a layer of metal such as copper or aluminum). The electrically-conductive plate can be patterned to include a plurality of fine-pitch conductive fingers that are spaced apart from each other with air gaps between each conductive finger to form a conductive finger-like structure. In one implementation, the conductive electrostatic shield 50 can be an etched side of a printed circuit board (PCB). In another implementation, the conductive electrostatic shield 50 can be a flexible carrier with a conductive coating.

The conductive fingers of the conductive electrostatic shield 50 are grounded by an electrical coupling 34 to the vehicle ground reference 39. The conductive fingers of the conductive electrostatic shield 50 are geometrically spaced apart from each other (e.g., not interconnected except at the base conductor 52). Appropriate fine pitch apertures or air gaps are provided between the conductive fingers of the conductive electrostatic shield 50. The presence of the air gaps between conductive fingers of the conductive electrostatic shield 50 reduces the conductive surface area, and also ensures that the conductive fingers do not touch each other, which avoids any shorted loops that can adversely impact inductive charging. The air gaps reduce the ability of the conductive electrostatic shield 50 to develop eddy currents that would significantly reduce effectiveness of inductive charging process.

The conductive electrostatic shield 50 can reduce or eliminate electromagnetic interference (EMI) that might otherwise potentially be received by nearby electronics modules or AM/FM antennas of the vehicle. This can prevent interference with electronics modules and degradation of AM/FM radio reception.

Conductive Faraday Cage Enclosure Embodiment

In another embodiment that is illustrated in FIGS. 9 through 11B, the partial Faraday cage apparatus is a conductive partial Faraday cage enclosure 60. In general, the conductive partial Faraday cage enclosure can be made from either a solid electrically conductive material or meshed electrically conductive material.

Figure 9:
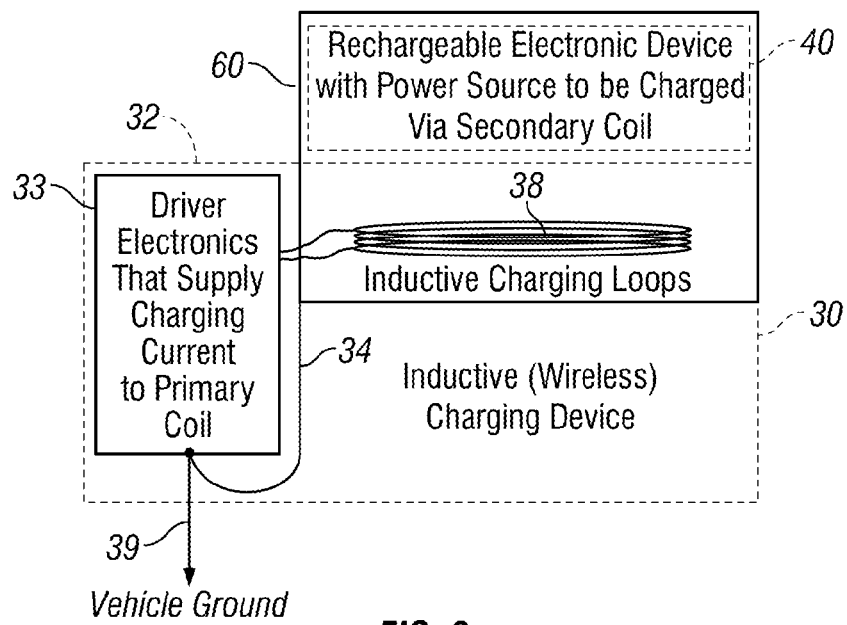
FIG. 9 is a block diagram of a cross-sectional side view of a wireless charging module in accordance with some of the other disclosed embodiments.

In the exemplary implementation that is illustrated in FIGS. 9 through 11B, the conductive partial Faraday cage enclosure 60 is implemented as a grounded five-sided box that can be used to create a "partial Faraday cage." FIG. 9 is a block diagram of a cross-sectional side view of a wireless charging module in accordance with some of the other disclosed embodiments. Many of the features of FIG. 9 are described above with respect to FIGS. 7 and 8, and for sake of brevity a description of those features will not be repeated again.

In this embodiment, the shield 50 is replaced with the conductive partial Faraday cage enclosure 60. However, it is noted that in some implementations (not illustrated) that both the shield 50 and the conductive partial Faraday cage enclosure 60 can be used together to provide even better EMI protection. The conductive partial Faraday cage enclosure 60 at least partially encloses and overlies the primary inductive charging coils 38, and encompasses an area occupied by the primary inductive charging coils 38.

Like the shield 50 of FIGS. 7 and 8, the conductive partial Faraday cage enclosure 60 is designed to significantly reduce electric fields radiated by the wireless charging module 30 above the conductive partial Faraday cage enclosure 60 and thus prevent them from being coupled to other electronics modules or antennas of the vehicle, while still permitting the magnetic field energy to be radiated in the region between the wireless charging module 30 and the rechargeable electronic device 40 so that the wireless charging module 30 can still charge a load that is inductively coupled to a primary coil 38 of the wireless charging module 30. The conductive partial Faraday cage enclosure 60 can reduce or eliminate electromagnetic interference (EMI) that might otherwise potentially be received by nearby electronics modules or AM/FM antennas of the vehicle. This can prevent interference with electronics modules and degradation of AM/FM radio reception.

Figure 10A:
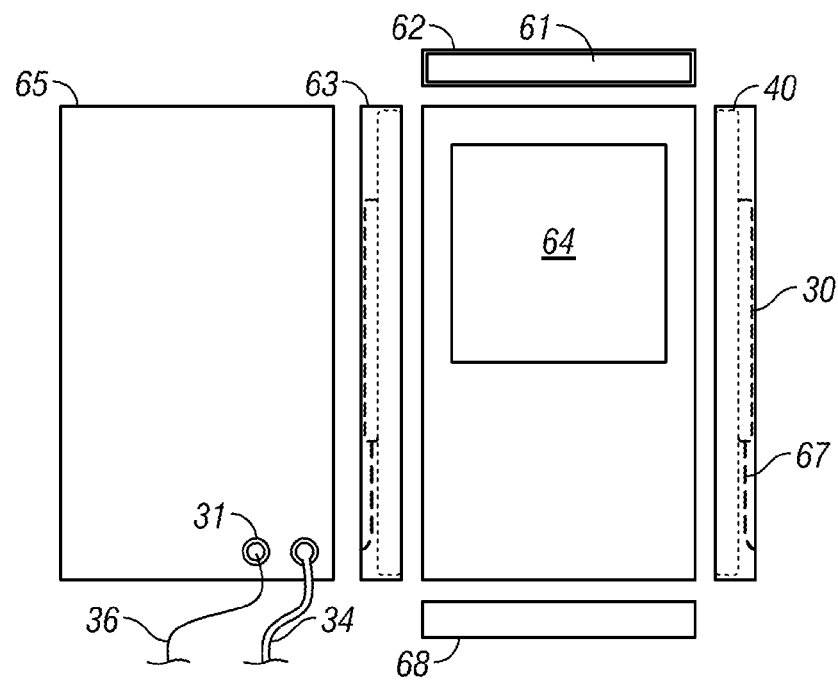
FIG. 10A is a diagram of various plates that may be used to construct a conductive partial Faraday cage enclosure of the wireless charging module of FIG. 9 in accordance with some of the other disclosed embodiments.
Figure 10B:
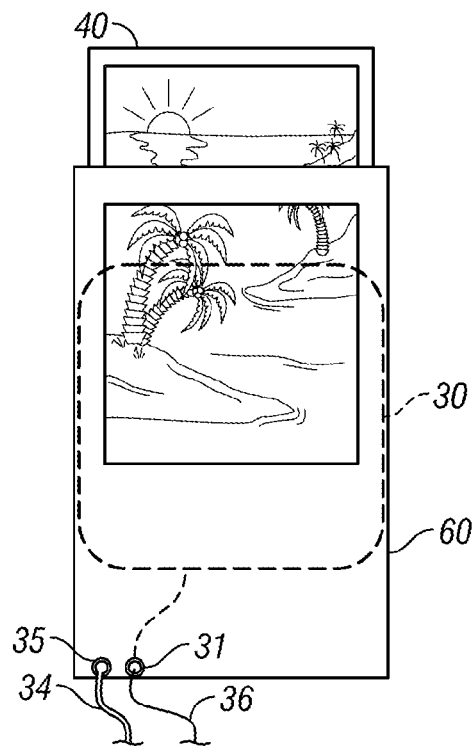
FIG. 10B is a conceptual diagram of the conductive partial Faraday cage enclosure of the wireless charging module of FIG. 10A after the conductive partial Faraday cage enclosure has been assembled and after the rechargeable electronic device partially inserted into the conductive partial Faraday cage enclosure of the wireless charging module.
Figure 10C:
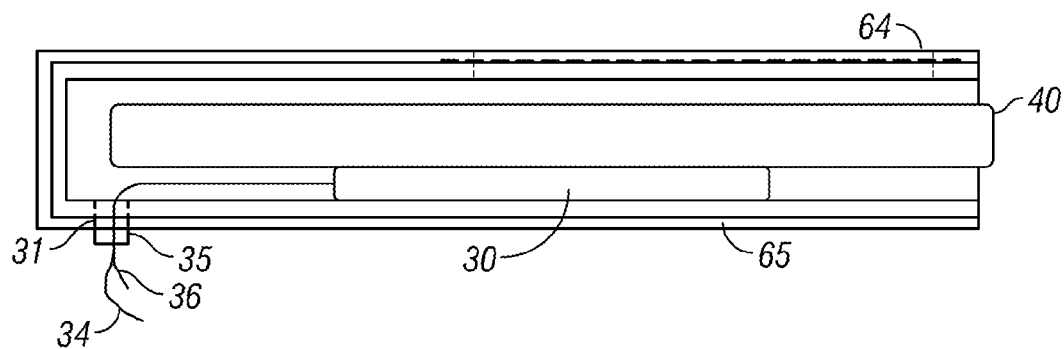
FIG. 10C is a cross-sectional diagram of the conductive partial Faraday cage enclosure and the wireless charging module in accordance with some of the other disclosed embodiments after the rechargeable electronic device has been inserted into the conductive partial Faraday cage enclosure.

A wide variety of different five-sided shielding boxes can be implemented in conjunction with the disclosed embodiments. In some implementations, the conductive partial Faraday cage enclosure 60 is assembled from parts (e.g., panels or plates) that can be fastened together. For example, FIG. 10A is a diagram of various plates 62, 63, 65, 67, 68 that may be used to construct a conductive partial Faraday cage enclosure 60 of the wireless charging module of FIG. 9 in accordance with some of the other disclosed embodiments. FIG. 10B is a conceptual diagram of the conductive partial Faraday cage enclosure 60 of the wireless charging module of FIG. 10A after the conductive partial Faraday cage enclosure 60 has been assembled and after the rechargeable electronic device 40 partially inserted into the conductive partial Faraday cage enclosure 60 of the wireless charging module. The various features of FIG. 10B are described above with respect to FIG. 10A, and therefore their description will not be repeated again for sake of brevity. FIG. 10C is a cross-sectional diagram of the conductive partial Faraday cage enclosure 60 and the wireless charging module 30 in accordance with some of the other disclosed embodiments after the rechargeable electronic device 40 has been inserted into the conductive partial Faraday cage enclosure 60.

Figure 11A:
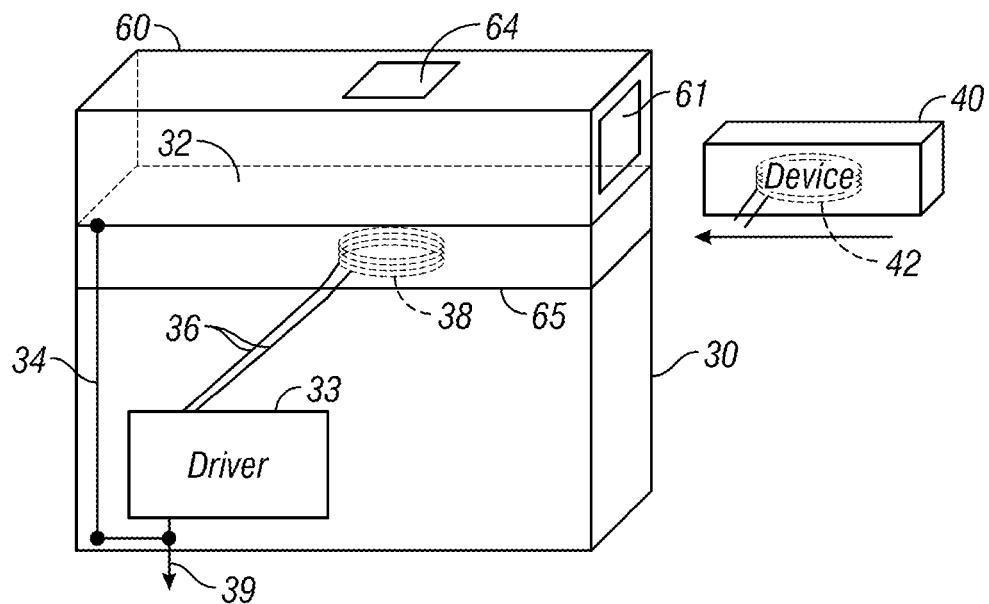
FIG. 11A is a conceptual diagram that illustrates a conductive partial Faraday cage enclosure integrated with a wireless charging module before a rechargeable electronic device is placed inside the conductive partial Faraday cage enclosure and onto a charging surface of the wireless charging module.
Figure 11B:
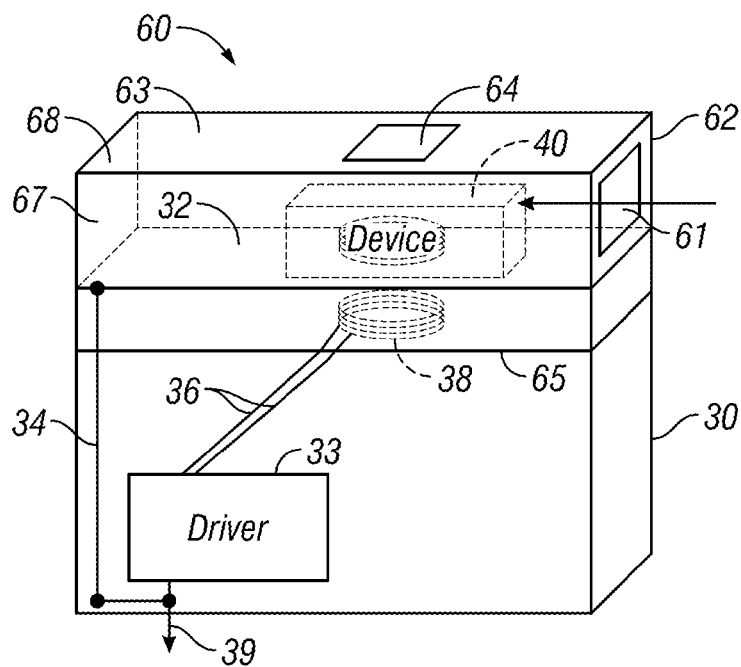
FIG. 11B is a conceptual diagram that illustrates the conductive partial Faraday cage enclosure integrated with the wireless charging module after the rechargeable electronic device is placed inside the conductive partial Faraday cage enclosure and onto the charging surface of the wireless charging module.

As illustrated in FIGS. 10A through 10C, the wireless charging module 30 can be disposed within the conductive partial Faraday cage enclosure 60. The conductive partial Faraday cage enclosure 60 includes a front-end panel 61 having an aperture 62 defined therein, a rear-end panel 68, side panels 63, 67, a bottom panel 65, and a top panel 66 having an opening 64 defined therein. The bottom panel 65 has a galvanic connection 35 for connection to a grounding wire 34 that will be electrically coupled to the vehicle ground reference. The wireless charging module 30 can be mounted on the bottom panel 65, and therefore, the bottom panel 65 has an aperture 31 that accommodates an electrical connection 36 between the driver electronics 33 and the primary coil 38 of the wireless charging module 30. In some implementations, the top panel 66 includes an opening 64 that allows observation of a screen on the device 40. In one implementation, the opening 64 in the top panel 66 may optionally be covered by a screen filter (not numbered) to filter out high frequencies. Various other features can be included. For example, interior insulating liners can be included on the various panels of the conductive partial Faraday cage enclosure 60 to prevent the enclosure 60 from adversely affecting antenna designs on some devices 40 such as wireless communication devices. Once the conductive partial Faraday cage enclosure 60 is assembled, a rechargeable electronic device 40 can be inserted into the conductive partial Faraday cage enclosure 60 so that it is position overlying the wireless charging module 30, as illustrated in FIGS. 9, 10B, 10C. An example is illustrated in FIGS. 11A and 11B. FIG. 11A illustrates the conductive partial Faraday cage enclosure 60 having an integrated wireless charging module 30 before a rechargeable electronic device 40 is placed inside the conductive partial Faraday cage enclosure 60 and onto a charging surface 32 of the wireless charging module 30, and FIG. 11B illustrates the conductive partial Faraday cage enclosure 60 after the rechargeable electronic device 40 is placed inside the conductive partial Faraday cage enclosure 60 and onto the charging surface 32 of the wireless charging module 30. This implementation of the conductive partial Faraday cage enclosure 60 has the added benefit in that it helps prevent motion of the rechargeable electronic device 40 while vehicle is in motion.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:
1. A vehicle, comprising:
electronic components mounted in or on the vehicle;
a console comprising a base and a lid; and
a wireless battery charging system, comprising:
   a wireless battery charging apparatus mounted within the base of the console, the wireless battery charging apparatus comprising: a primary coil that is designed to inductively couple magnetic energy for wirelessly charging a rechargeable electronic device; and an electrostatic shield disposed in the console above the primary coil of the wireless battery charging apparatus to reduce electromagnetic fields generated by the primary coil from being coupled to the electronic components of the vehicle.

2. The vehicle according to claim 1, wherein the electronic components comprise a radio antenna mounted in or on the vehicle.

3. The vehicle according to claim 1, wherein the electronic components comprise an electronics module mounted in or on the vehicle.

4. The vehicle according to claim 1, wherein the electrostatic shield comprises:
a partial Faraday cage apparatus configured to reduce electric fields radiated by the primary coil from being coupled to the electronics components and substantially prevent the electromagnetic energy radiated by the primary coil from being received by the electronics components.

5. The vehicle according to claim 4, wherein the electrostatic shield comprises a conductor located overlying the primary coil within the wireless battery charging apparatus.

6. The vehicle according to claim 5, wherein the conductor is configured to significantly reduce electric fields radiated by the primary coil in a region above the conductor and to prevent the electric fields radiated by the primary coil from being coupled to the electronics components that are mounted in or on the vehicle, while still permitting the magnetic field energy to be radiated in the region above the conductor.

7. The vehicle according to claim 5, wherein the conductor has a width dimension greater than a width dimension of the primary coil.

8. The vehicle according to claim 5, wherein the primary coil is part of a wireless charging module, and wherein the conductor is embedded within the wireless charging module such that the conductor is disposed overlying the primary coil.

9. The vehicle according to claim 8, wherein the wireless charging module comprises a charging surface located above the conductor, and wherein the vehicle comprises a ground reference, and
wherein the conductor comprises a shielded portion, and wherein electrical coupling between the ground reference and the shielded portion of the conductor electrically grounds the conductor to attenuate undesired electric field components generated by the primary coil such that the undesired electric field components are not coupled to the electronics components while permitting magnetic field energy to charge the rechargeable electronic device that resides on the charging surface.

10. The vehicle according to claim 9, wherein the rechargeable electronic device is a wireless communication device, and wherein the conductive electrostatic shield is designed to attenuate undesired field components that would otherwise interfere with the electronic components, while allowing the intended field components including communication transmit and communication receive signals to be transmitted from or received by the wireless communication device.

11. The vehicle according to claim 5, wherein the conductor comprises an electrically-conductive plate.

12. The vehicle according to claim 11, wherein the electrically-conductive plate comprises one or more conductive layers.

13. The vehicle according to claim 12, wherein the one or more conductive layers comprise a layer of ferrite material on a layer of metal.

14. The vehicle according to claim 5, wherein the conductor comprises a conductive finger-like structure that includes a base conductor and a plurality of fine-pitch conductive fingers that extend from the base conductor, wherein the plurality of fine-pitch conductive fingers are spaced apart from each other with air gaps between each fin-pitch conductive finger.

15. The vehicle according to claim 14, wherein the vehicle comprises a ground reference, and wherein the plurality of fine-pitch conductive fingers are grounded by an electrical coupling to the ground reference.

16. The vehicle according to claim 15, wherein the electrostatic shield comprises an etched side of a printed circuit board (PCB).

17. The vehicle according to claim 15, wherein the electrostatic shield comprises a flexible carrier with a conductive coating.

18. The vehicle according to claim 4, wherein the vehicle comprises a ground reference, and wherein the partial Faraday cage apparatus comprises:
an enclosure that is made of a conductive material that is electrically coupled to the ground reference, wherein the enclosure includes an aperture into which the rechargeable electronic device is inserted, wherein the enclosure comprises a solid conductive material or meshed conductive material.

19. The vehicle according to claim 18, wherein the enclosure comprises a grounded five-sided box that comprises five-plates that are fastened together.

20. The vehicle according to claim 18, wherein the enclosure encompasses and at least partially encloses the primary coil, and wherein the enclosure is disposed overlying the primary coil.

21. A vehicle, comprising:
electronic components mounted in or on the vehicle;
a wireless battery charging system, comprising:
a wireless battery charging apparatus mounted within the vehicle, the wireless battery charging apparatus comprising: a primary coil that is designed to inductively couple magnetic energy for wirelessly charging a rechargeable electronic device; and
an electrostatic shield designed to reduce electromagnetic fields from being coupled to the electronic components of the vehicle, wherein the electrostatic shield comprises:
a conductor located overlying the primary coil within the wireless battery charging apparatus, the conductor comprising:
a conductive finger-like structure that includes a base conductor and a plurality of fine-pitch conductive fingers that extend from the base conductor, wherein the plurality of fine-pitch conductive fingers are spaced apart from each other with air gaps between each fine-pitch conductive finger.

22. A vehicle according to claim 21, wherein the vehicle comprises a ground reference, and wherein the plurality of fine-pitch conductive fingers are grounded by an electrical coupling to the ground reference.

23. A vehicle, comprising:
electronic components mounted in or on the vehicle;
a wireless battery charging system, comprising:
a wireless battery charging apparatus mounted within the vehicle, the wireless battery charging apparatus comprising: a primary coil that is designed to inductively couple magnetic energy for wirelessly charging a rechargeable electronic device; and an electrostatic shield designed to reduce electromagnetic fields from being coupled to the electronic components of the vehicle, wherein the electrostatic shield comprises:
  a box-shaped enclosure that is made of a conductive material that is electrically coupled to the ground reference, wherein the box-shaped enclosure includes an aperture into which the rechargeable electronic device is inserted, wherein the box-shaped enclosure comprises a solid conductive material or meshed conductive material that is configured to reduce electric fields radiated by the primary coil from being coupled to the electronics components and substantially prevent the electromagnetic energy radiated by the primary coil from being received by the electronics components.

24. A vehicle according to claim 23, wherein the box-shaped enclosure comprises:
  a grounded five-sided box that comprises five-plates that are fastened together.

25. A vehicle according to claim 23, wherein the box-shaped enclosure encompasses and at least partially encloses the primary coil, and wherein the box-shaped enclosure is disposed overlying the primary coil.

* * * * *